(12) United States Patent
Lee et al.

(10) Patent No.: US 8,841,944 B1
(45) Date of Patent: Sep. 23, 2014

(54) FREQUENCY QUADRUPLERS AT MILLIMETER-WAVE FREQUENCIES

(71) Applicant: International Business Machines Corporation, Armonk, NY (US)

(72) Inventors: Wooram Lee, Irvine, CA (US); Alberto Valdes Garcia, Hartsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 13/846,044

(22) Filed: Mar. 18, 2013

(51) Int. Cl.
*H03B 19/00* (2006.01)
(52) U.S. Cl.
USPC .......................................... 327/119; 333/218
(58) Field of Classification Search
USPC ................... 327/116, 119–123; 333/218
See application file for complete search history.

(56) References Cited

U.S. PATENT DOCUMENTS

| | | | |
|---|---|---|---|
| 4,660,006 A * | 4/1987 | Tajima et al. | 333/218 |
| 5,136,720 A * | 8/1992 | Titus et al. | 455/323 |
| 5,815,014 A | 9/1998 | Zhang et al. | |
| 2006/0145737 A1 | 7/2006 | Yamamoto et al. | |
| 2007/0069824 A1 | 3/2007 | Kintis et al. | |
| 2007/0273454 A1 | 11/2007 | Pepper | |
| 2013/0229210 A1* | 9/2013 | Siles et al. | 327/119 |

FOREIGN PATENT DOCUMENTS

| | | |
|---|---|---|
| CN | 101534109 A | 9/2009 |
| CN | 102104363 A | 6/2011 |

OTHER PUBLICATIONS

Abbasi, M., et al. "Single-Chip Frequency Multiplier Chains for Millimeter-Wave Signal Generation" IEEE Transactions on Microwave Theory and Techniques, vol. 57, No. 12. Dec. 2009. pp. 3134-3142.

* cited by examiner

*Primary Examiner* — Quan Tra
(74) *Attorney, Agent, or Firm* — Tutunjian & Bitetto, P.C.; Anne V. Dougherty

(57) ABSTRACT

A symmetric frequency multiplier includes four non-linear devices configured to receive an input signal having a fundamental mode and to provide an output having one or more harmonics; and three collinear transmission lines, each having a length of about one quarter of an input wavelength, configured to receive the outputs of the non-linear devices and configured to combine bifurcated components of the signals from the non-linear devices into two frequency-multiplied output signals. Two of the signals from the non-linear devices are provided at respective ends of the collinear transmission lines and two of the signals from the non-linear devices are provided between transmission lines, such that each of the bifurcated components of a given signal passes through a different subset of the transmission lines.

11 Claims, 6 Drawing Sheets

FREQUENCY QUADRUPLERS AT MILLIMETER-WAVE FREQUENCIES

BACKGROUND

1. Technical Field

The present invention relates to frequency multipliers and, more particularly, to frequency quadruplers that operate at millimeter-wave frequencies.

2. Description of the Related Art

Frequency multipliers are important components in millimeter-wave (mmWave) data communication, radar, and imaging systems. Frequency multipliers often need filtering structures to reject the fundamental component of a signal and any other unwanted components. Since it is hard to generate output power at high frequencies, particularly at mmWave frequencies, power combining structures may be used to add the power from individual sources. However, both filters and power combiners increase the frequency multiplier's surface area on a chip and introduce substantial losses in the output signal path.

SUMMARY

A frequency multiplier includes a pair of non-linear devices configured to receive an input signal having a fundamental mode and to provide an output having one or more harmonics; and a set of transmission lines configured to receive two bifurcated input signals from the pair of non-linear devices and further configured to combine components of the bifurcated input signals into a frequency-multiplied output signal. The set of transmission lines includes a first transmission line having a length of about one quarter the input wavelength; and an unterminated second transmission line having a length of about one eighth the input wavelength. One component of each of the two bifurcated input signals reflects in the unterminated second transmission line.

A frequency multiplier includes four non-linear devices configured to receive an input signal having a fundamental mode and to provide an output having one or more harmonics; and three collinear transmission lines, each having a length of about one quarter of an input wavelength, configured to receive the outputs of the non-linear devices and configured to combine bifurcated components of the signals from the non-linear devices into two frequency-multiplied output signals. Two of the signals from the non-linear devices are provided at respective ends of the collinear transmission lines and two of the signals from the non-linear devices are provided between transmission lines, such that each of the bifurcated components of a given signal passes through a different subset of the transmission lines.

A method for increasing a signal frequency includes generating two or more signals having a fundamental mode and one or more harmonics; phase shifting bifurcated components of the two or more signals in transmission lines; and combining the bifurcated components to create an output signal that cancels a fundamental mode, a second harmonic, and a third harmonic in the signals to produce a frequency-multiplied output signal.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide a frequency multiplier that combines the fourth-order harmonics from each of a set of transistors and rejects other harmonics, including the fundamental frequency. The structure of the present embodiments is based on a single-ended input, simplifying configuration. The present embodiments may be implemented using transmission lines, which makes them suitable for use in the millimeter-wave (mmWave) regime. In addition, an output impedance of the proposed frequency multiplier is equal to the characteristic impedance of the transmission line. By choosing a proper value of the characteristic impedance, output matching can be easily implemented without an additional matching network. These embodiments may be scaled to form a structure that can deliver output power at multiple ports.

Figure 1:
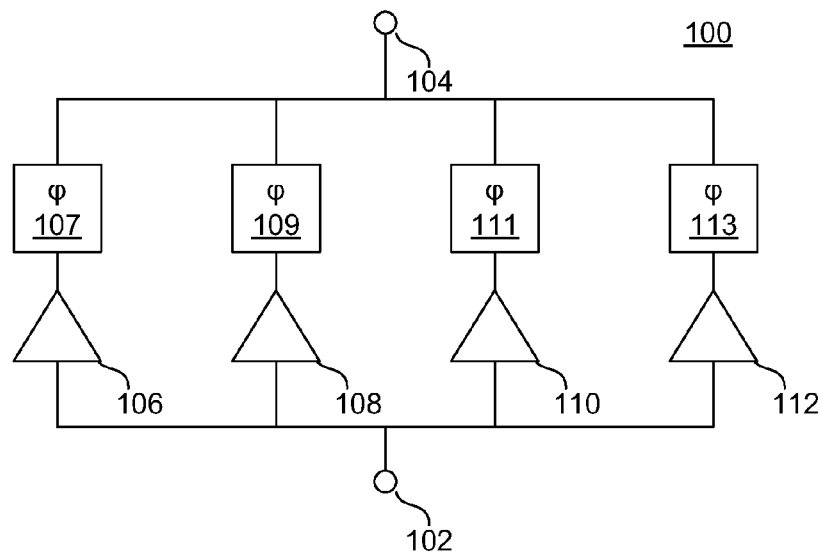
FIG. 1 is a diagram of a simplified frequency quadrupler in accordance with the present principles.

Referring now to the drawings in which like numerals represent the same or similar elements and initially to FIG. 1, an idealized frequency quadrupler 100 is shown. An input 102 is provided with a fundamental mode $\omega$ and an output 104 is produced at the fourth harmonic, $4\omega$. To produce the output 104, the input signal is split into four, with each signal generating multiple harmonics through a nonlinear device (106, 108, 110, 112) such as a bipolar/MOSFET transistor, a Schottky diode, or a MOS varactor, and phase-shifted by a different amount at a phase shifter (107, 109, 111, 113). The non-linear devices are used to generate the harmonics that are selected to produce a frequency-multiplied signal. Transistors 106, 108, 110, and 112 used as nonlinear devices generate amplified signals having at least a second, a third, and a fourth harmonic. A first phase shifter 107 has a phase shift of zero, a second phase shifter 109 has a phase shift of 90 degrees, a third phase shifter 111 has a phase shift at 180 degrees, and a fourth phase shifter 113 has a phase shift of 270 degrees. When these four signals combine at the output 104, the fundamental mode and the second harmonic cancel, leaving the fourth harmonic. In particular, the outputs of phase shifters 107 and 109 cancel the fundamental mode with the outputs of 111 and 113, while the outputs of 107 and 111 cancel the second harmonic with the outputs of 109 and 111.

Figure 2:
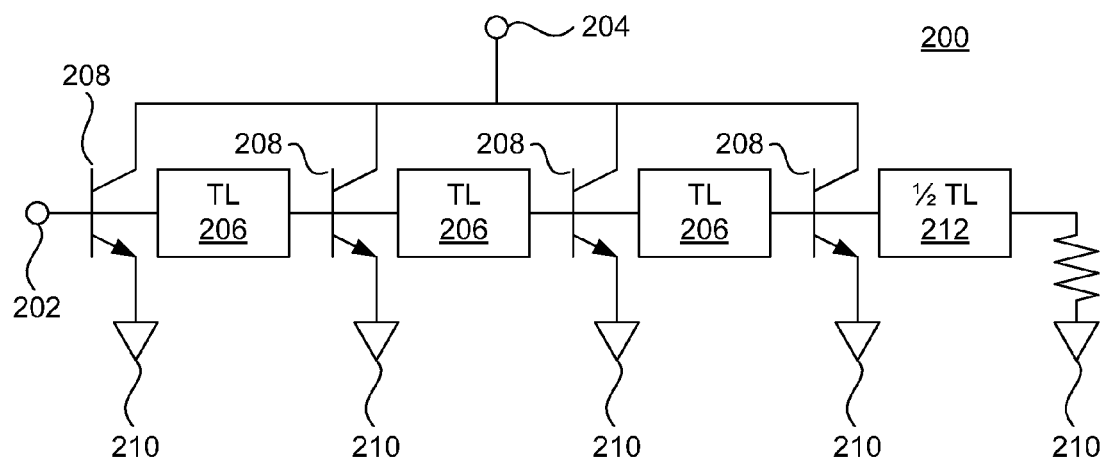
FIG. 2 is a diagram of a frequency quadrupler in accordance with the present principles.

Referring now to FIG. 2, a transmission-line frequency quadrupler 200 is shown. The quadrupler receives an input signal 202 with a fundamental mode of $\omega$ and produces an output signal 204 having a frequency of $4\omega$. The common input 202 is provided to transistors 208 in sequence, with each transistor 208 being separated from the last by a phase shifting transmission line 206. The transmission lines 206 have a length of about ¼λ, causing a phase shift of 90 degrees for the fundamental frequency ω. It should be recognized that a length of exactly ¼λ applies to ideal transmission lines. Realistic transmission lines will deviate slightly from the ideal value, and those having ordinary skill in the art will be able to select a transmission line of appropriate length to produce the 90 degree phase shift.

As a result of the transmission lines 206, each transistor 208 will be triggered by a phase-shifted version of the input signal 202. The first transistor 208 will have a signal with a zero degree phase, the second transistor 208 will have a signal with a 90 degree phase, the third transistor 208 will have a signal with a 180 degree phase, and the fourth transistor will have a signal with a 270 degree phase. Each transistor 208 amplifies the fundamental input frequency and generates, $2^{nd}$, $3^{rd}$, $4^{th}$ and higher order harmonics. Due to the phase shift at the input, the fundamental, second, and third harmonics will cancel while the fourth harmonic will be added coherently. The input signal 202 is finally connected to a power dissipation structure that includes, e.g., a transmission line 210 having a length of about ⅛λ, to prevent signal reflections reentering the quadrupler 200.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
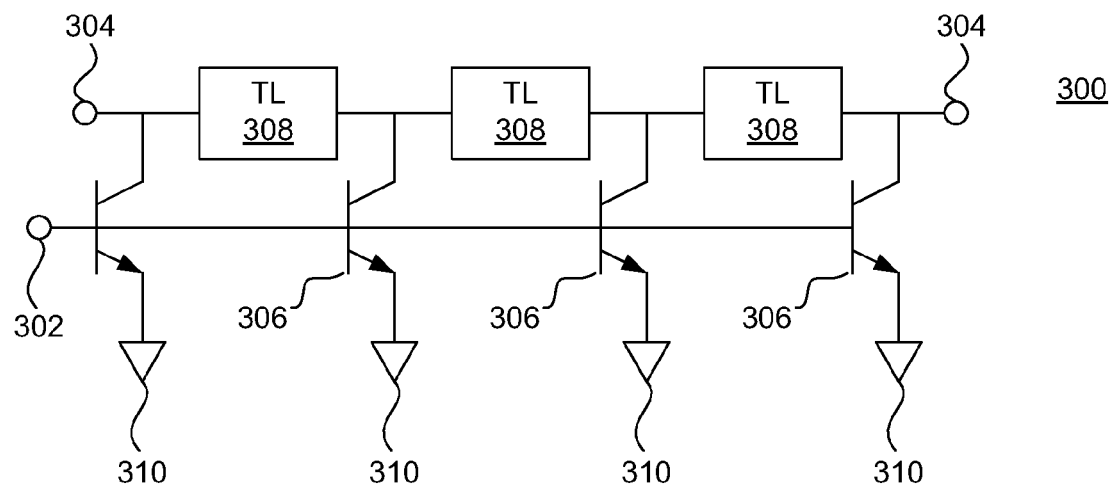
FIG. 3 is a diagram of a symmetrical frequency quadrupler in accordance with the present principles.

Referring now to FIG. 3, a symmetrical frequency quadrupler 300 is shown that has a single input 302 and two outputs 304. The input 302 has a fundamental mode of ω and is provided to four transistors 306, each being connected to ground 310. The transistors 306 are connected to collinear transmission lines 308, each having a length of about ¼ω. It should be recognized that, in the present usage, "collinear" refers to the transmission lines being arranged end-to-end, rather than according to the geometric meaning of the term.

It should be recognized that each of the four transistors 306 contributes to each of the two output signals 304. For example, the first transistor 306 will provide a component to one output 304 that has a zero degree phase shift and a component to the second output 304 that has a phase shift of 270 degrees. This structure provides the above-described combination of four phases at each of the outputs 304, resulting in a cancellation of the fundamental mode and the second harmonic, leaving the fourth harmonic.

Figure 4:
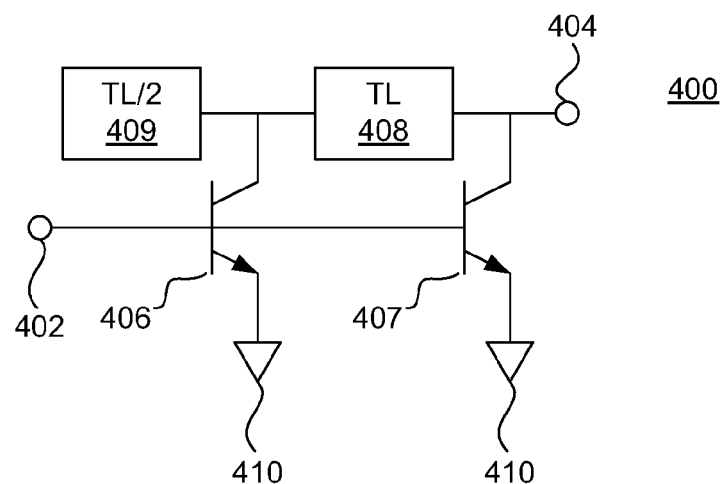
FIG. 4 is a diagram of a frequency quadrupler in accordance with the present principles.

Referring now to FIG. 4, a simplified quadrupler 400 is shown that exploits the symmetry of quadrupler 300. Because quadrupler 300 takes a single input and produces two identical outputs, having with each output being generated by signals passing through the same transmission lines 308 in a different direction, the circuit can be simplified to produce a single output. The symmetrical quadrupler 400 accepts an input 402 having a fundamental mode at ω and produces an output 404 at the fourth harmonic 4ω. As in the symmetric quadrupler 300, the input 402 is applied equally to transistors 406 and 407, which are each connected to ground 410. The transistors 406 and 407 each contribute two components to the output 404. As the signal leaves the transistor 407, the signal bifurcates, with a first signal forming an unshifted component to the output 404. The second component passes through a first transmission line 408 having a length of about ¼λ and then enters a second, terminating transmission line 409 having a length of about ⅛λ. The second signal is reflected at the terminus of the second transmission line 409 and passes through the first transmission line 408 again. The result of this reflected signal path is that the second component of the signal from the first transistor 407 is phase shifted a total of 270 degrees.

The signal from transistor 406 is similarly bifurcated, producing a first component that passes through the first transmission line 408 directly to the output 404 with a phase shift of 90 degrees, while the second component is reflected in the second transmission line 409 before passing through the first transmission line 408, accruing a phase shift of 180 degrees. The sum of the four components at the output 404 cancels out the fundamental mode and the second harmonic, leaving the fourth harmonic. If additional rejection of the fundamental mode is needed, an optional transmission line can be added at the output to filter signals at ω.

The embodiment in FIG. 4 is simplified for the sake of description. In a realistic circuit, there may be a load impedance at output 404 to absorb power at the $4^{th}$ harmonic, such that nothing is reflected. The input 402 may have an input matching network before connecting to the signal source. As noted above, a termination at the input 402 is not needed due to the inputs to transistors 406 and 407 being connected.

Figure 5:
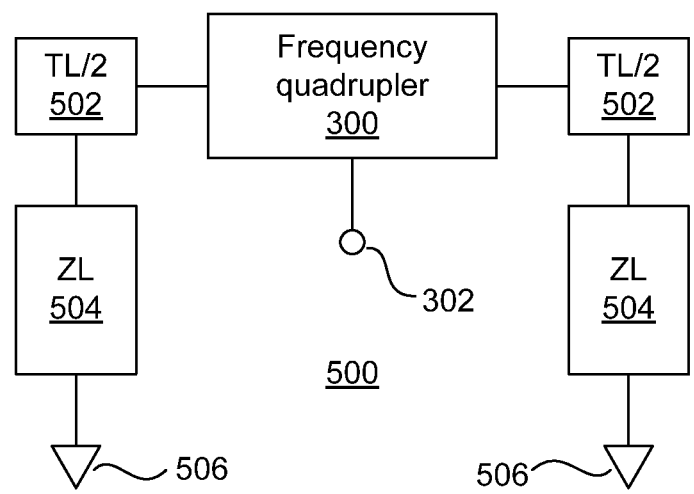
FIG. 5 is a diagram of a modular symmetrical frequency quadrupler in accordance with the present principles.

Referring now to FIG. 5, an extension of the present principles is shown that can provide a modular, multiple-output frequency quadrupler 500. The outputs of a symmetrical quadrupler 300 having an input 302 are filtered with a transmission line having a length ⅛λ and a load impedance 504. The load impedance is connected to ground 506.

Figure 6:
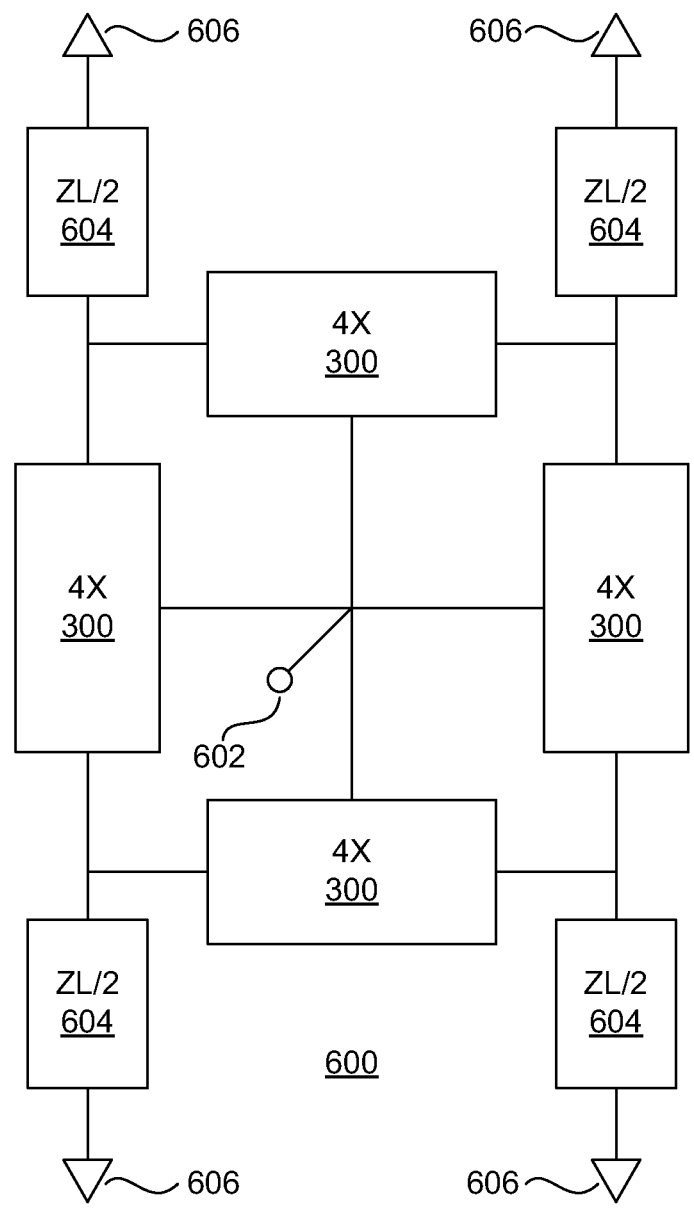
FIG. 6 is a diagram of an array of symmetrical frequency quadruplers in accordance with the present principles.

Referring now to FIG. 6, a power combining structure 600 is shown. The power combining structure accepts an input signal 602 that is provided to each of four symmetric frequency quadruplers 300. The outputs of the quadruplers 300 are provided to an impedance load 604 before going to ground 606. This structure may be particularly useful in, for example, signal broadcasting where antennas form the impedance loads 604. This allows the power outputs of the quadruplers 300 to be combined in space. To accomplish this, the antennas 604 are equally spaced from the input 602, such that transmissions occur in-phase. It should be noted that the listed impedance for the loads 604 is half that shown in FIG. 5. If each branch is expecting to see, e.g., 50 ohms, then a load 604 of 25 ohms will appear to be 50 ohms by each branch because each branch will inject the same amount of current.

Figure 7:
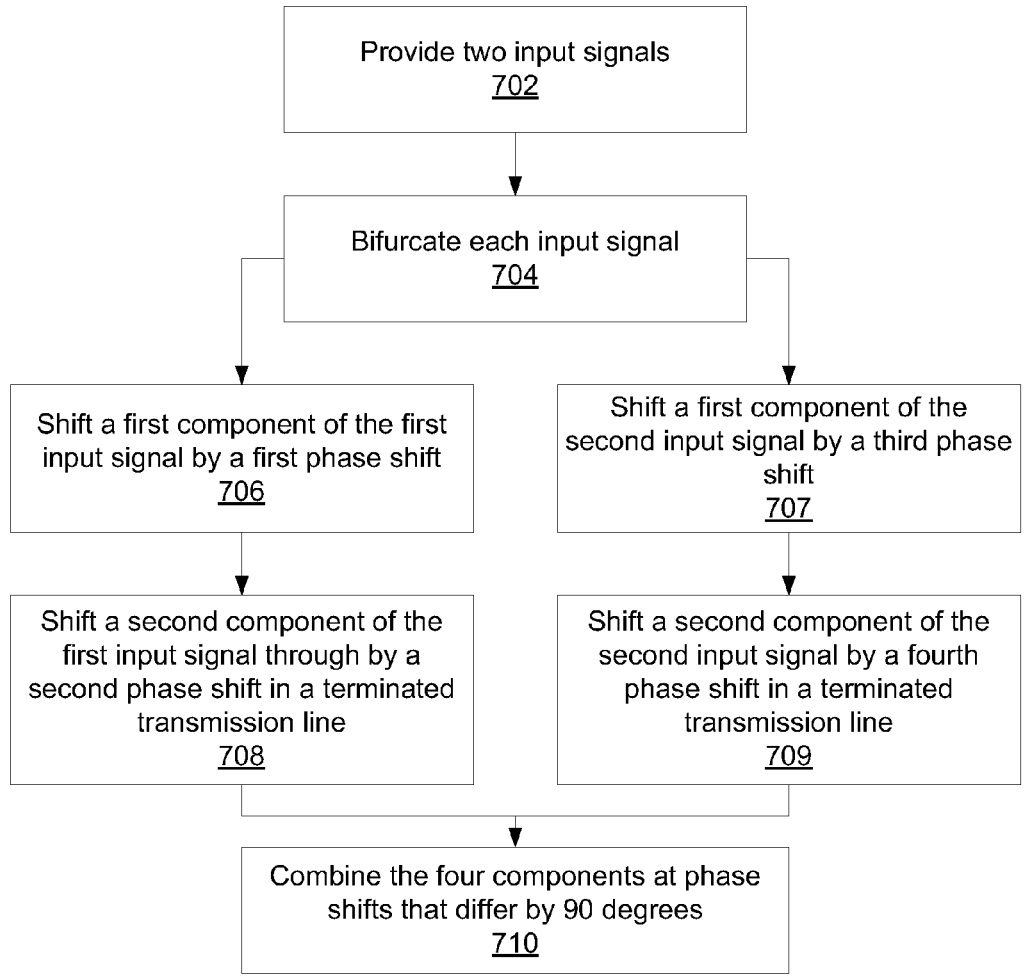
FIG. 7 is a block/flow diagram of a method for quadrupling an input frequency in accordance with the present principles.

Referring now to FIG. 7, a method of quadrupling a signal frequency is shown. Block 702 provides two input signals to a frequency quadrupler. The input signals should be two versions of the same signal. Block 704 bifurcates each of the signals, producing a total of four versions of the input signal. For the first pair of signals, block 706 shifts the first component by a first phase shift and block 708 shifts the second component by a second phase shift. Block 708 accomplishes its phase shift at least in part by reflecting the signal in a terminated transmission line. According to the frequency quadrupler shown in FIG. 4, these phase shifts may be, e.g., zero and 270 degrees respectively. For the second pair of signals, block 707 shifts the first component by a third phase shift and block 709 shifts the second component by a fourth phase shift. Block 709 accomplishes its phase shift at least in part by reflecting the signal in a terminated transmission line. Following again the example of FIG. 4, these phase shifts may be 90 and 180 degrees respectively.

Block 710 recombines the four components to create the quadrupled frequency. It should be recognized that the actual values of the phase shifts are less important than the fact that they are each 90 degrees apart with respect to one another. As described above, combining four 90-degree-separated signals cancels the fundamental mode, the second harmonic, and the third harmonic, leaving the fourth harmonic. Although this process is described with respect to the embodiment shown in FIG. 4, it should be recognized that any appropriate structure may be employed to implement the frequency quadrupling.

Figure 8:
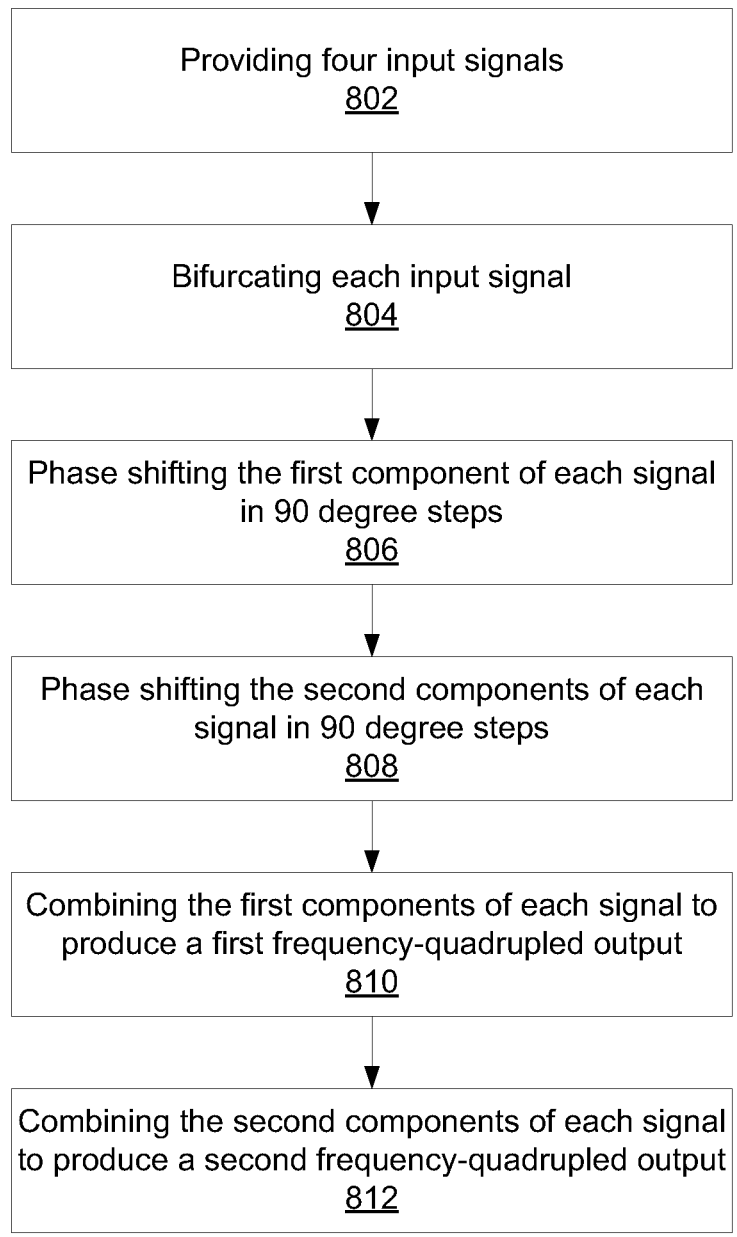
FIG. 8 is a block/flow diagram of a method for quadrupling an input frequency in accordance with the present principles.

Referring now to FIG. 8, a further embodiment of a method for quadrupling a frequency of a signal is shown. Block 802 provides four identical inputs. Block 804 bifurcates the four input signals, producing a first and a second component of each signal. For the sake of illustration, consider FIG. 3, with the first component of each signal going toward the left output 304 and the second component of each signal going toward the right output 304.

Block 806 phase shifts the first component of each signal in 90 degree steps. In other words, the first component of a first signal is shifted zero degrees, the first component of the second signal is shifted by 90 degrees, and so on. Block 808 phase shifts the second component of each signal in 90 degree steps. It should be recognized that the initial value of the phase shift isn't important, as long as each signal component has a 90 degree phase difference with respect to its two neighboring components. Block 810 combines the first components of each signal at a first output 304 to produce a first frequency-quadrupled output. Block 812 combines the second components of each signal at a second output 306 to produce a second frequency-quadrupled output. The result is the generation of two outputs, each having a frequency four times that of the input signal.

Having described preferred embodiments of frequency quadruplers at millimeter-wave frequencies (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A frequency multiplier, comprising:
   a pair of non-linear devices configured to receive an input signal having a fundamental mode and to provide an output having one or more harmonics;
   a set of transmission lines configured to receive two bifurcated input signals from the pair of non-linear devices and further configured to combine components of the bifurcated input signals into a frequency-multiplied output signal, wherein the set of transmission lines comprises:
   a first transmission line having a length of about one quarter the input wavelength; and
   an unterminated second transmission line having a length of about one eighth the input wavelength,
   wherein one component of each of the two bifurcated input signals reflects in the unterminated second transmission line.

2. The frequency multiplier of claim 1, wherein the output signal has a frequency about four times higher than a frequency of the fundamental mode present in the input signal.

3. The frequency multiplier of claim 1, wherein the output signal combines four signal components such that a fundamental mode, a second harmonic, and a third harmonic of the input signals cancel, leaving a fourth harmonic.

4. The frequency multiplier of claim 3, wherein the components of the bifurcated input signals are each phase shifted by a different amount in the transmission lines, such that the output combines four components having ninety-degree phase differences.

5. The frequency multiplier of claim 1, wherein the input signals are millimeter-wave signals.

6. The frequency multiplier of claim 1, wherein the non-linear devices are amplifiers.

7. A frequency multiplier, comprising:
four non-linear devices configured to receive an input signal having a fundamental mode and to provide an output having one or more harmonics;
three collinear transmission lines, each having a length of about one quarter of an input wavelength, configured to receive the outputs of the non-linear devices and configured to combine bifurcated components of the signals from the non-linear devices into two frequency-multiplied output signals,
wherein two of the signals from the non-linear devices are provided at respective ends of the collinear transmission lines and two of the signals from the non-linear devices are provided between transmission lines, such that each of the bifurcated components of a given signal passes through a different subset of the transmission lines.

8. The frequency multiplier of claim 7, wherein the frequency-multiplied output signals have a frequency about four times higher than a fundamental mode present in the input signal.

9. The frequency multiplier of claim 7, wherein each output signal combines four signal components such that a fundamental mode, a second harmonic, and third harmonic of the input signals cancel, leaving a fourth harmonic.

10. The frequency multiplier of claim 9, wherein the bifurcated signals from the four non-linear devices are each phase shifted by a different amount in the transmission lines, such that outputs of the transmission lines combine four components having ninety-degree phase differences.

11. The frequency multiplier of claim 7, wherein the input signals are millimeter-wave signals.

* * * * *